United States Patent [19]

Kim

[11] Patent Number: 5,595,934

[45] Date of Patent: Jan. 21, 1997

[54] METHOD FOR FORMING OXIDE PROTECTIVE FILM ON BONDING PADS OF SEMICONDUCTOR CHIPS BY UV/$O_3$ TREATMENT

[75] Inventor: Yoon S. Kim, Seoul, Rep. of Korea

[73] Assignee: Samsung Electronics Co., Ltd., Suwon, Rep. of Korea

[21] Appl. No.: 505,910

[22] Filed: Jul. 24, 1995

[30] Foreign Application Priority Data

May 17, 1995 [KR] Rep. of Korea ................... 1995-12206

[51] Int. Cl.[6] ................................................. H01L 21/44
[52] U.S. Cl. ..................... 437/180; 437/182; 437/187; 437/188
[58] Field of Search ............................. 437/180, 182, 437/188, 187; 148/285, 415, 437, 688, DIG. 118; 427/126.4

[56] References Cited

U.S. PATENT DOCUMENTS

| | | | |
|---|---|---|---|
| 5,134,093 | 7/1992 | Onishi et al. | 148/285 |
| 5,213,996 | 5/1993 | Ogawa | 437/187 |
| 5,330,935 | 7/1994 | Dobuzinsky et al. | 148/DIG. 118 |
| 5,334,544 | 8/1994 | Matsuoka et al. | 148/DIG. 118 |
| 5,338,393 | 8/1994 | Burmer | 437/187 |

FOREIGN PATENT DOCUMENTS 50-50687  5/1975  Japan .
56-116634  9/1981  Japan .

OTHER PUBLICATIONS

ISTFA'93: the 19th, International Symposium for Testing & Failure Analysis, USA/15–19 Nov. 1993, Improvement of Moisture resistance by the New Surface Treatment of Aluminum Bonding Pads in LSI, T. Miyakawa et al, pp. 331–334.

*Primary Examiner*—Kevin M. Picardat
*Attorney, Agent, or Firm*—Cushman Darby & Cushman IP Group of Pillsbury Madison & Sutro LLP

[57] ABSTRACT

A method for forming a protective oxide film on the bonding pads of a semiconductor chip which is to be encapsulated by a molded-in-place capsule of plastic material including exposing a chip having bonding pads (while the chip is in the form of wafer), to $O_3$ and ultraviolet (UV) radiation, so that excited oxygen generated from the $O_3$ by UV radiation oxidizes metal atoms, for example aluminum atom of the aluminum bonding pads, to form a fine oxide film over the bonding pads, this film providing protection from water and/or ions which would otherwise cause corrosion of the bonding pads.

10 Claims, 1 Drawing Sheet

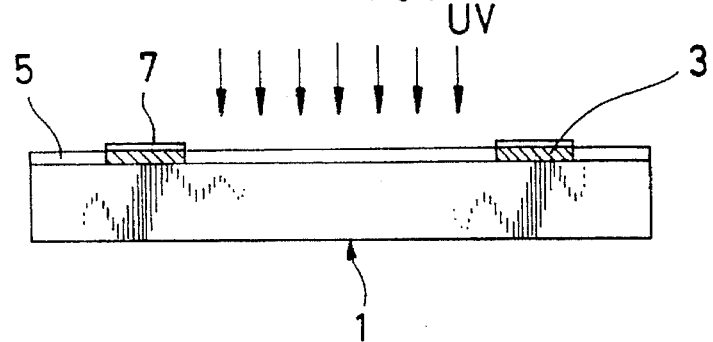
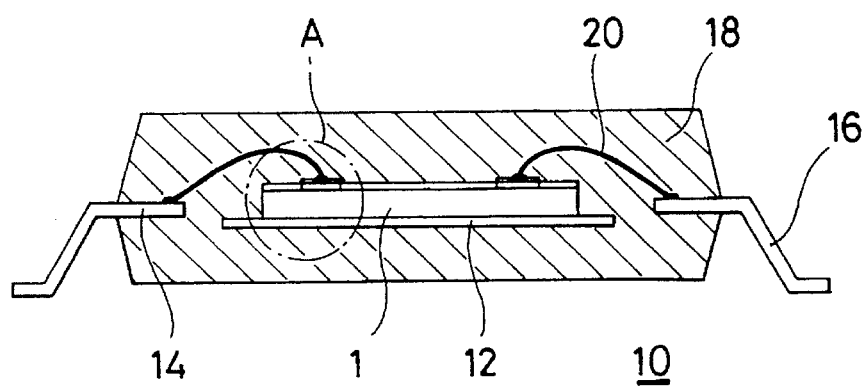
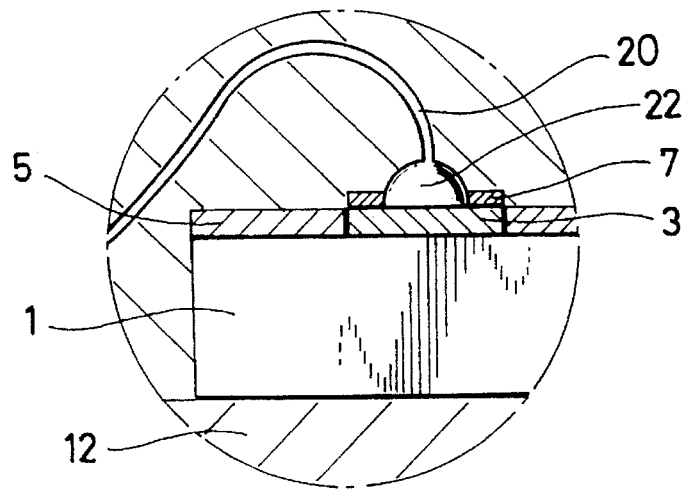

METHOD FOR FORMING OXIDE PROTECTIVE FILM ON BONDING PADS OF SEMICONDUCTOR CHIPS BY UV/O₃ TREATMENT

BACKGROUND OF THE INVENTION

1. Field of the Invention

The present invention is generally related to a method for manufacturing semiconductor devices, and more particularly to a method for forming an oxide protective film on the bonding pads of a semiconductor chip, using excited oxygen generated from air or $O_3$ by UV irradiation.

2. Prior Art

Semiconductor chips, each formed with a desired circuit pattern by a wafer process, are subjected to a bonding pad-mounting process for facilitating making electrical connections to external elements. After depositing an Al-metal layer on a chip, the whole surface of the chip is covered with a passivation layer, except the bonding pad mounting areas, and then subjected to a packaging process. The purpose of the packaging process is to protect chip from the external environmental influences such as dust, heat, moisture, electrical and mechanical loads and the like, and to electrically connect the semiconductor elements to the external elements. In the packaging process, the chip is encapsulated with metal, ceramic material, or resin (a resin-type molding material) by an encapsulation process.

The package encapsulated with a plastic material, such as epoxy resin, has many advantages from economic and productivity viewpoints. Nevertheless, it also has a disadvantage, for example that the corrosion at aluminum bonding pads frequently occurs due to moisture absorbed by the epoxy resin and penetrated through the gap between the lead frame of the packaged chip, and the plastic resin, or package cracks. In particular, during Pressure Cooker Test (PCT), a method for testing the reliability of the packaged device in which the package is subjected to moisture environment at about 2 atm., at 121±2° C., moisture penetrates into the epoxy resin, or into the gap between the resin and the lead frame, which results in corrosion at the bonding pads where protection by a passivation layer is not provided.

Various attempts have been made to prevent this corrosion. For example, methods have been proposed, in which a protective layer, for preventing penetrations of moisture and halogen ions which cause corrosion, is formed on the bonding pads. However, these methods are not commonly used, since it is difficult to apply them to the packaging process, or to obtain satisfactory results.

In particular, JP 56-116634A discloses a method for forming a protective film on the aluminum bonding pads by exposing the semiconductor device to high temperature vapor, after conducting the wire-bonding step. Further, in JP 52-50687A, the semiconductor device is immersed in high temperature water, at 80°–250° C., for 5–100 minutes, to form a hydroxide film on the aluminum bonding pads. These methods, however, also cannot be applied in practical uses, since the vapor or water inherently contains OH⁻ or H⁺ and these may cause corrosion.

Another method has been proposed, in which a polymer such as silicone gel is deposited onto the surface of the chip, after wire bonding process, to form a diffusion barrier film. Although the diffusion barrier film is formed to prevent penetration of moisture or ions, the film cannot provide effective protection from moisture or ions, because the polymer itself has a relatively high water-absorption properties.

Miyakawa proposed a method for forming a fine aluminum oxide film on aluminum bonding pads, in order to prevent corrosion due to moisture penetration. [Improvement of Moisture Resistance by the New Surface Treatment of Aluminum Bonding Pads in LSI, T. Miyakawa et al., ISTFA '93, The 19th International Symposium for Testing & Failure Analysis] Miyakawa teaches immersion of a semiconductor wafer in an $O_3$ solution in the last step of the wafer production process, to form an aluminum oxide film over the bonding pads. By doing this, failures during the PCT can be significantly decreased.

However, according to the Miyakawa's method, the aluminum oxide film is formed by bubbling $O_3$ into deionized water (DI water) to increase the concentration of $O_3$ in the water, and then immersing the wafer thereinto. Therefore, the reactivity of $O_3$ in water is lower than that of $O_3$ in air, because the former has a lower diffusion coefficient than the latter. Further, the wafer is exposed to contaminants in the $O_3$ solution.

SUMMARY OF THE INVENTION

Therefore, an object of the invention is to provide a method for manufacturing semiconductor chips, in which the bonding pads are covered with a protective film in a simple and effective way.

Another object of the invention is to provide a method for forming a protecting film on the bonding pads of a semiconductor chip, which comprises the steps of:

preparing a semiconductor chip provided with metal bonding pads, the chip being covered with a passivation film over its surface, except for at the bonding pad mounting areas;

exposing the chip to an $O_3$ atmosphere; and irradiating simultaneously, with ultra-violet rays, the $O_3$, to generate excited oxygen atoms, which then react with the metal of the bonding pads to form an oxide protective film on the bonding pads.

The other objects, features and applications of the present invention shall be easily apparent to those skilled in the art from the following detailed description.

BRIEF DESCRIPTION OF DRAWINGS

FIG. 1 is a cross-sectional view of a semiconductor chip having bonding pads covered with a protective layer according to the present invention;

FIG. 2 is a schematic cross-sectional view showing the connections between inner leads and bonding pads covered with protective layer by means of wires; and FIG. 3 is an enlarged view of the "A" part of the FIG. 2.

DETAILED DESCRIPTION OF PREFERRED EMBODIMENT OF THE INVENTION

FIG. 1 is a cross-sectional view of a semiconductor chip having metal bonding pads covered with a protective layer according to the present invention. The bonding pads (3) are mounted on the chip (1), which is formed so as to have a circuit pattern, using a wafer process. The chip (1) is covered with a passivation film (5) on its overall surface, except on its bonding pad mounting areas, to protect the pattern. The thus prepared chip, which is in the form of the wafer, is then exposed to an $O_3$ atmosphere. At the same time, the wafer is irradiated by means of ultra-violet (UV) radiation to generate excited oxygen from the $O_3$. The excited oxygen reacts with the metal atoms of the bonding pads to form a fine metal oxide film on the bonding pads (3). Since the bonding pads are usually made of aluminum, the resulting film is composed of aluminum oxide ($Al_2O_3$).

The above-described protective film-formation process according to the present invention is referred to as "$O_3$/UV treatment" hereinafter.

The $O_3$/UV treatment of the present invention may be carried out as the last step of the wafer production process, and may be accomplished by using a conventional UV/Ozone Cleaning machine. The conditions of $O_3$/UV treatment in accordance with the present invention are as follows:

| | |
|---|---|
| Wave length of UV ray | 253.7 nm or 184.9 nm |
| Time period of UV ray irradiation | 5 to 10 minutes |
| Temperature of bonding pad during the $O_3$ treatment | about 150° C. |
| Film thickness | <50 Å |

Chemical reactions of protective film formation are represented by forming as follows:

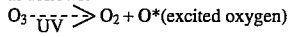

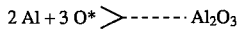

The protective film ($Al_2O_3$) formed by $O_3$/UV treatment improves corrosion resistance of the chip.

FIG. 2 is a schematic cross-sectional view of a package having bonding pads covered with the protective layer, these bonding pads being connected to inner leads through wires; and FIG. 3 is an enlarged view of "A" part of the FIG. 2.

With reference now to FIG. 2 and FIG. 3, the package (10) includes the chip (1), a die pad (12), inner leads (14), outer leads (16) and a molded-in-place capsule of molding resin (18). The chip (1) is mounted on the die pad (12) using an adhesive, for example silver epoxy. The bonding pads (3) are electrically connected to the inner leads (14) by means of wires (20). The outer leads (16) are electrically connected to external terminals (not shown). The package (10) is protected by the molding resin (18).

With reference now to FIG. 3, the bonding pads (3), which are covered with $Al_2O_3$ protective film (7) by the $O_3$/UV treatment, are subjected to a wire-bonding process. The wire (20) is bonded to the bonding pad (3) by, for example, the ball bonding process, involving the ball (22). Although the bonding pads (3) are covered with the protective film (7) according to the present invention, since the thickness of the film is as thin as less than 50Å, and severe conditions of very high temperature and pressure, or ultrasonic energy are applied to the bonding pads, the film (7) is destroyed at the area of the ball bonding, so that the ball (22) can be completely bonded to the bonding pad (3).

As described hereinabove, the excited oxygen generated from $O_3$ by UV radiation oxidizes the metal atoms of the bonding pads, for example, the aluminum atoms of the aluminum bonding pads, to form a fine film over the bonding pads, so that the film can provide protection from water and/or ions which would otherwise cause corrosion of the bonding pads. Even if complete prevention of moisture penetration is not possible, the time period for penetrating moisture into the bonding pads can be significantly increased, which consequently results in an increase in the reliability of the semiconductor chip.

This invention may be practiced or embodied in still other ways without departing from the spirit or essential character thereof. The preferred embodiment described herein is therefore illustrative and not restrictive, the scope of the invention being indicated by the appended claims, and all variations which come within the meaning of the claims are intended to be included therein.

What I claim is:

1. A method for manufacturing a semiconductor chip, comprising:
   (a) providing a chip having a circuit pattern and metal bonding pads thereon;
   (b) covering the chip with a passivation film, except on said bonding pads;
   (c) simultaneously,
      (i) exposing the chip to an $O_3$ atmosphere, and
      (ii) irradiating the chip using ultraviolet (UV) radiation, thereby generating excited oxygen, which reacts with metal atoms of said metal bonding pads, to form a fine metal oxide film on the bonding pads, thereby providing a protective film on said bonding pads.

2. The method of claim 1, wherein:
   said bonding pads are made of aluminum, and said protective film is a metal oxide film made of $Al_2O_3$.

3. The method of claim 1, wherein:
   in the step of irradiating, using ultraviolet radiation having a wavelength of 253.7 nm or 184.9 nm.

4. The method of claim 3, wherein:
   said step of irradiating is practiced on said chip for 5 to 10 minutes.

5. The method of claim 4, further comprising:
   maintaining said chip at about 150° C. while conducting said step of irradiating.

6. The method of claim 1, wherein:
   said protective film has a thickness of less than 50Å.

7. The method of claim 1, wherein:
   steps (a)–(c)(ii) are conducted while the chip remains integrally related to other chips, in a wafer, each of which is simultaneously subjected to steps (a)–(c)(ii); and, thereafter, separating said chips from said wafer.

8. The method of claim 1, further comprising:
   (d) adhering the chip to a die pad;
   (e) electrically connecting said bonding pads to respective inner leads of a lead frame by respective wires; and
   molding a protective capsule of plastic material about said chip so as to embed said chip, said die pad, said wires, and said inner leads of said lead frame, in said capsule of plastic material.

9. The method of claim 8, wherein:
   said protective film, as provided in step (c) has a thickness of less than 50Å, and, in step (e), respective of said wires are electrically connected to respective of said bonding pads by ball bonding, during which said film is destroyed where said ball bonding connects respective said wires to respective said bonding pads.

10. The method of claim 9, wherein:
    said bonding pads are made of aluminum, and said protective film is a metal oxide film made of $Al_2O_3$;
    in the step of irradiating, using ultraviolet radiation having a wavelength of 253.7 nm or 184.9 nm;
    said step of irradiating is practiced on said chip for 5 to 10 minutes; and
    further comprising:
    maintaining said chip at about 150° C. while conducting said step of irradiating.

* * * * *